United States Patent
Chengalva et al.

(10) Patent No.: US 6,979,900 B2
(45) Date of Patent: Dec. 27, 2005

(54) INTEGRATED CIRCUIT PACKAGE WITH INTEGRAL LEADFRAME CONVECTOR AND METHOD THEREFOR

(75) Inventors: Suresh K. Chengalva, Kokomo, IN (US); Bruce A. Myers, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 85 days.

(21) Appl. No.: 10/689,822

(22) Filed: Oct. 21, 2003

(65) Prior Publication Data

US 2005/0082660 A1   Apr. 21, 2005

(51) Int. Cl.[7] .................... H01L 23/10; H01L 23/34
(52) U.S. Cl. ............... 257/706; 257/692; 257/696
(58) Field of Search ............... 257/706, 702, 257/787, 666, 676, 675, 692, 696, 707

(56) References Cited

U.S. PATENT DOCUMENTS

| | | | |
|---|---|---|---|
| 5,644,164 A * | 7/1997 | Roh ........................... | 257/712 |
| 5,861,669 A * | 1/1999 | Sono et al. .................. | 257/696 |
| 6,242,797 B1 * | 6/2001 | Ichikawa et al. ........... | 257/666 |
| 6,262,475 B1 * | 7/2001 | Liu et al. .................... | 257/675 |
| 6,262,489 B1 | 7/2001 | Koors et al. ................ | 257/784 |
| 6,396,133 B1 * | 5/2002 | James ......................... | 257/675 |
| 2004/0000703 A1 * | 1/2004 | Lee et al. ................... | 257/675 |

OTHER PUBLICATIONS

U.S. Appl. No. 10/177,940, filed Jun. 21, 2002, Delheimer.

* cited by examiner

*Primary Examiner*—S. V. Clark
(74) *Attorney, Agent, or Firm*—Stefan V. Chmielewski

(57) ABSTRACT

An electronic package and packaging method in which integral convective fins are formed of portions of a leadframe from which electrical leads are also formed. The leadframe comprises a base and first and second sets of leads extending from the base. The first set of leads is separated from the base and from the second set of leads, such that each lead of the first set has an interior end adjacent but separate from the base, and each lead of the second set has an interior portion that remains attached to the base. A circuit device is mounted to the base and electrically connected to the interior ends of the first set of leads. The device, base, and interior ends and portions of the leads are then encased within a housing. Exterior ends of the leads remain outside the housing as package terminals and thermal dissipaters.

18 Claims, 2 Drawing Sheets

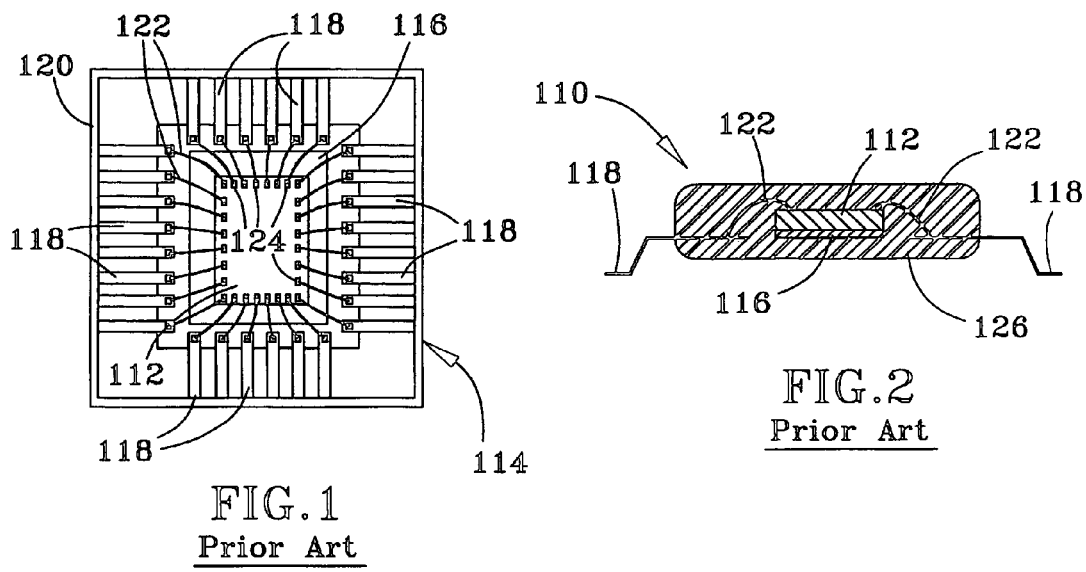
FIG.1
Prior Art
FIG.2
Prior Art
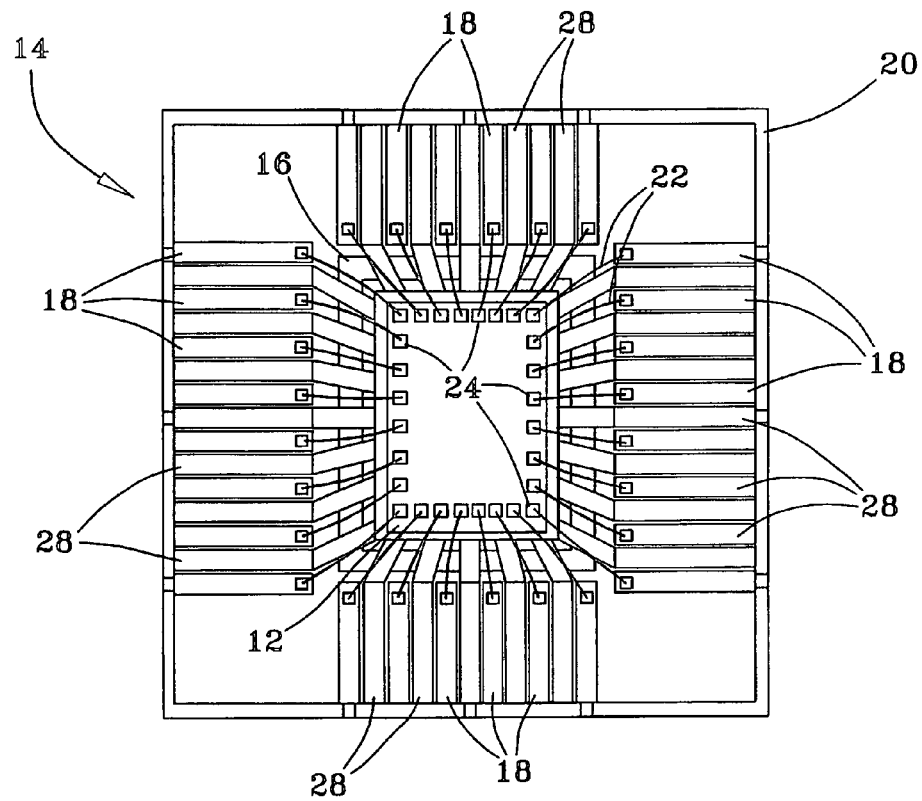
FIG.3 ized with the electrical leads as a result of being formed from the same leadframe. Alternatively or in addition, unused electrical leads can be used to form some or all of the thermal leads, in which case the electrical leads designated to form the

INTEGRATED CIRCUIT PACKAGE WITH INTEGRAL LEADFRAME CONVECTOR AND METHOD THEREFOR

BACKGROUND OF THE INVENTION (1) Field of the Invention

The present invention generally relates to packaging for circuit devices. More particularly, this invention relates to an electronic package and packaging method by which a leadframe is used to form electrical leads as well as thermal convectors for the package.

(2) Description of the Related Art

Semiconductor IC devices are at times enclosed in a protective housing to form an IC package, which can then be mounted on a circuit board or other suitable substrate using well known bonding techniques, such as soldering and brazing. The IC devices are typically mounted to a substrate or leadframe, and the resulting assembly is enclosed within a molded housing to form the IC package. Input/output (I/O) leads project through the walls of the housing and are electrically connected to the components within the housing by wire bonding or another suitable technique. The leads may be formed as part of a leadframe around which the housing is molded. Electronic components, typically active IC devices (e.g., transistors and diodes), are mounted on enlarged portions ("paddles") of the leadframe. The package is then electrically connected and possibly mounted to a circuit board with the leads.

An example of an IC package that makes use of a leadframe is represented in FIGS. 1 and 2. FIG. 1 represents an intermediate process step showing an IC chip 112 mounted to a paddle 116 of a leadframe 114. The leadframe 114 further includes leads 118 and an outer support frame 120. FIG. 1 shows the leads 118 as having been separated from the paddle 116, and wire bonds 122 electrically connecting the leads 118 to bond pads 124 on the chip 112. FIG. 2 represents a cross-sectional view of a package 110 produced by overmolding the chip 112 and paddle 116 of FIG. 1 to produce an overmolded housing 126 from which the leads 118 protrude. FIG. 2 also depicts the package 110 following removal of the support frame 120 and forming of the leads 118 to permit mounting of the package 110 to a substrate.

IC devices generate heat during their operation, resulting in increased junction temperatures for the devices. Because IC reliability and function are adversely affected by high junction temperatures, many IC packages require features to remove heat from the IC device. Various solutions for removing heat from IC packages have been proposed. Most of these approaches involve placing the IC device in contact with a metal slug or an internal frame, which conduct thermal energy from the IC device to a surface of the package. Heat is then removed from the package surface by conduction into a separate heat sink or into the circuit board on which the package is mounted. In many existing concepts, thermal energy is eventually dissipated by convection into the surrounding air using fins thermally connected to the heat sink or circuit board.

While effective, the above approaches require secondary assembly processes and separate heat sinks, which add cost to the electronic assembly. It would be desirable to dissipate heat from an IC package having simplified construction and assembly requirements.

BRIEF SUMMARY OF THE INVENTION

The present invention provides an electronic package and packaging method, in which the package has integral convective fins for dissipating heat from the package. The fins can be formed from portions of a leadframe that would otherwise be removed and discarded from the package during forming of electrical leads for a circuit device housed in the package.

The package of this invention generally includes a molded housing, a circuit device encased within the housing, multiple electrical leads extending from the housing, and a thermally-conductive support structure electrically separate from the electrical leads. Each of the electrical leads has an interior end within the housing, adjacent but separate from the circuit device, and electrically connected to the circuit device. Each of the electrical leads also has an exterior end outside of the housing and adapted for electrical connection to a substrate. The thermally-conductive support structure comprises a base portion within the housing and multiple thermal leads integral with and extending from the base portion. The circuit device is attached to the base portion for thermal coupling therewith. The thermal leads protrude outside the housing and have distal ends configured to dissipate heat that has been conducted away from the circuit device through the base portion. According to a preferred aspect of the invention, the electrical leads are originally part of the support structure and separated from the base portion and the thermal leads during processing of the housing.

The packaging method of this invention generally entails providing a thermally and electrically conductive leadframe comprising a base portion and at least two sets of leads extending from the base portion. First and second sets of these leads correspond to the electrical and thermal leads, respectively, of the package described above. The first set of leads is separated from the base portion and from the second set of leads, such that each lead of the first set of leads has an interior end adjacent but separate from the base portion, and each lead of the second set of leads has an interior portion that remains attached to the base portion. A circuit device is mounted to the base portion, and the circuit device is electrically connected to the interior ends of the first set of leads. The circuit device, the base portion of the conductive leadframe, the interior ends of the first set of leads, and the interior portions of the second set of leads are then encased within a molded housing. The exterior ends of the first set of leads project outside of the housing as connector terminals for the circuit device, and the distal ends of the second set of leads project outside of the housing as thermal dissipaters for the circuit device.

From the above, one can see that the package and method of this invention are able to provide a simplified construction and assembly through the use of an initially single structure to produce two sets of leads that perform either an electrical connection function or a thermal dissipation function. As such, separate manufacturing steps previously required to form and then assemble and attach a discrete thermal dissipation element to an electronic package is eliminated. Notably, the second (thermal) set of leads of this invention can be formed with material conventionally discarded following the process of forming the first (electrical) set of leads from a conventional leadframe, in which case the thermal leads would typically be interdigitized with the electrical leads as a result of being formed from the same leadframe. Alternatively or in addition, unused electrical leads can be used to form some or all of the thermal leads, in which case the electrical leads designated to form the thermal leads would not be separated from the base portion (paddle) of the leadframe. In any case, the thermal leads are present during the molding operation and are subsequently deformed as required for the particular application. For example, the thermal leads can be configured to perform as convection fins or to support a separate finned heat sink. The number, locations, and widths of the thermal leads can be chosen to accommodate different packages, forming operations and molding operations. The thermal leads can also be adapted to transfer thermal energy to a variety of media, including air, liquids, solids, and phase change materials.

Other objects and advantages of this invention will be better appreciated from the following detailed description.

BRIEF DESCRIPTION OF THE DRAWINGS

FIG. 1 is a plan view showing an intermediate processing step of an IC package in accordance with the prior art.

FIG. 2 is a cross-sectional view of an IC package produced by a process that includes the process step represented in FIG. 1.

FIG. 3 is a plan view showing an intermediate processing step of an IC package in accordance with an embodiment of this present invention.

DETAILED DESCRIPTION OF THE INVENTION

Figure 6:
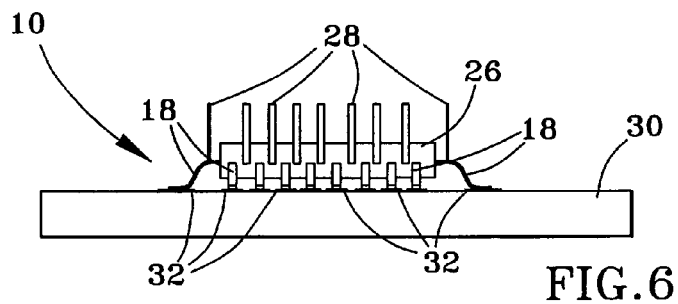
FIG. 6 is a side view of an IC package produced using the processing steps of FIGS. 3 and 5.

FIG. 6 represents an IC package 10 in accordance with a first embodiment of this invention. As illustrated, the package 10 is represented as being mounted to a substrate 30, such as a circuit board. The package 10 has an overmolded housing 26 from which two sets of leads 18 and 28 extend. The leads 18 and 28 are represented as diverging in opposite directions from the housing 26, with the leads 18 being bonded to bond pads 32 on the surface of the substrate 30 to electrically connect circuitry on the substrate 30 with an integrated circuit device (not shown) within the package 10. In contrast, the leads 28 do not serve an electrical function with respect to the package 10. Instead, the leads 28 extend away from the substrate 30, projecting above the package 10. In view of their separate functions, the leads 18 and 28 will be referred to as electrical leads 18 and thermal leads 28, respectively, in the following discussion.

Those skilled in the art will appreciate that the IC package 10 represented in FIG. 6 (as well as those represented in FIGS. 4, 5, and 7) could be adapted for use in a variety of applications, and consequently differ considerably from that shown in the Figures. For example, FIG. 6 represents the leads 18 and 28 as interdigitized along the perimeter of the package 10 and protruding from the package 10 in the same plane, though such a configuration is not a requirement in the practice of this invention.

FIG. 3 shows an intermediate step of the invention prior to forming the housing 26 of FIG. 6, so that the interior components of the package 10 are visible. In FIG. 3, an IC chip 12 is shown mounted to a region of a leadframe 14 referred to as a paddle 16. The chip 12 can be attached to the paddle 16 iii any manner suitable to achieve acceptable thermal coupling with the paddle 16, such as soldering or with a conductive adhesive. FIG. 3 also shows the leadframe 14 as comprising two sets of outwardly-extending leads interdigitized along the perimeter of the paddle 16. The leads are identified with reference numbers 18 and 28, in that they correspond to the electrical and thermal leads 18 and 28 of FIG. 6. According to the invention, the leadframe 14 is originally a unitary piece formed of an electrically and thermally conductive material, such as copper, a copper alloy, brass, etc. Integral within this unitary piece are the paddle 16, an outer support frame 20, and the leads 18 and 28 which extend in parallel between the paddle 16 and frame 20 and roughly perpendicular to the edges of the paddle 16 and frame 20 with which they intersect. In FIG. 3, the leadframe 14 has undergone an additional operation, such as stamping, etc., so that the electrical leads 18 are now separated from the paddle 16 and the thermal leads 28, but remain attached to the frame 20 for support. In contrast, the thermal leads 28 remain integral with both the paddle 16 and the frame 20. Electrical connections between the chip 12 and electrical leads 18 are represented as being made with wires 22 bonded to interior ends of the leads 18 and bond pads 24 on the chip 12, similar to the practice represented in FIG. 1, though other techniques for electrical connection could be used. In view of FIG. 3, the paddle 16 and thermal leads 28 can be electrically separated from the electrical leads 18 (with respect to current flow from and to the chip 12) by removing the frame 20 from the leadframe 14.

Figure 4:
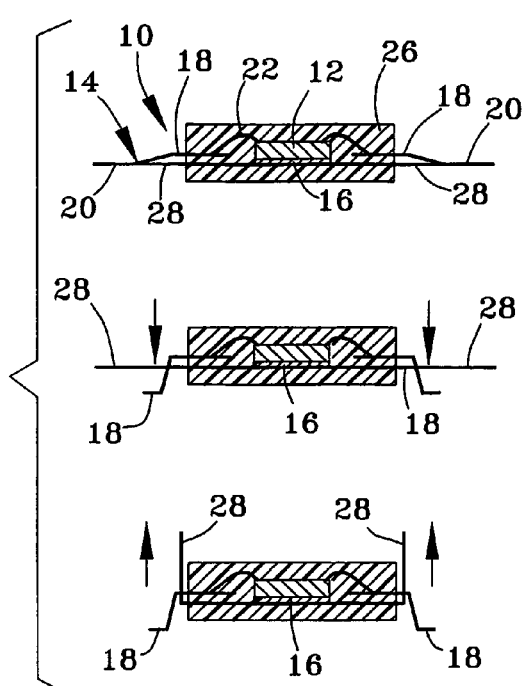
FIGS. 4 and 5 are cross-sectional views of alternative processing steps for producing IC packages following the intermediate processing step depicted in FIG. 3.
Figure 5:
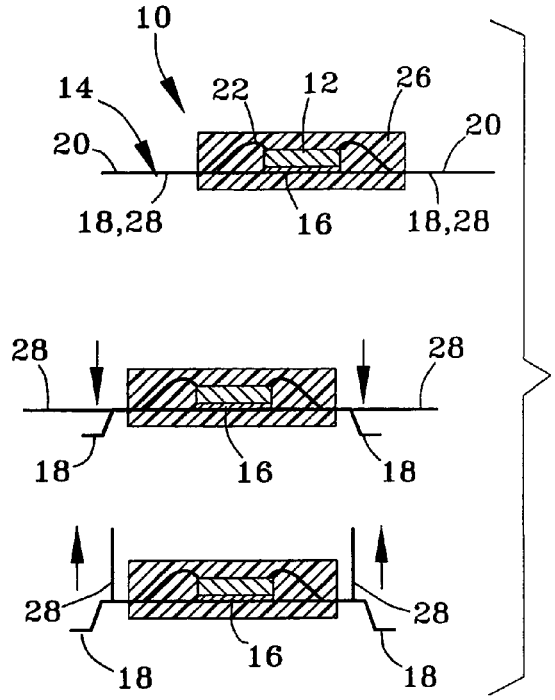

FIGS. 4 and 5 represent two approaches for further processing the assembly of FIG. 3 to produce an IC package. FIG. 4 shows post-molding processing of an assembly in which, prior to forming the housing 26, the interior ends of the electrical leads 18 were deflected upward into a separate but parallel plane in which the leadframe 14 lies, including its paddle 16, frame 20 and thermal leads 28. The paddle 16, the chip 12 mounted to the paddle 16, and the interior ends of the electrical and thermal leads 18 and 28 are then overmolded to produce a housing 26 from whose perimeter the leads 18 and 28 protrude. The term "overmolded" is used in its normal sense to refer to a process widely practiced to form IC packages, by which the leadframe 14 with the chip 12 mounted thereto are placed in a mold, and an overmolding compound in then injected into the mold to protectively encase the chip 12, the paddle 16, and the interior ends of the leads 18 and 28. In each of the views in FIG. 4, the interior ends of the electrical and thermal leads 18 and 28 are seen as offset from each other within the housing 26. Following removal of the frame 20 to electrically separate the thermal leads 28 from the electrical leads 18, the exterior ends of the electrical leads 18 are deformed in the direction traversing the offset as shown in the second view of FIG. 4. The exterior ends of the thermal leads 28 are also deformed to traverse the offset in a direction opposite that of the electrical leads 18, so that the leads 18 and 28 protrude in opposite directions outside as shown in the third view of FIG. 4. In this manner, mounting the resulting package to a substrate with the electrical leads 18 results in the thermal leads 28 projecting above the package, enabling their use as thermal convection fins that dissipate heat conducted from the chip 12 by the paddle 16.

FIG. 5 generally represents the identical processing steps as those depicted in FIG. 4, but without the offset step so that the paddle 16, leads 18 and 28, and frame 20 remain in a single plane immediately following the molding process. Thereafter, the exterior ends of the electrical and thermal leads 18 and 28 are bent as shown in the second and third views of FIG. 5, respectively, again with the result that the leads 18 and 28 extend in opposite directions. As such, the process represented in FIG. 5 also results in the thermal leads 28 projecting above the package to serve as thermal convection fins once the package has been attached to a substrate with the electrical leads 18, as shown in FIG. 6.

Figure 7:
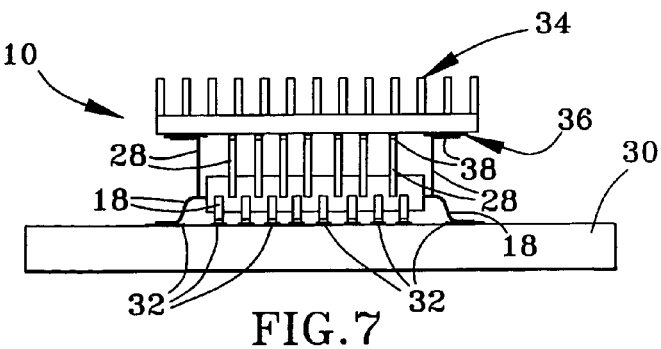
FIG. 7 is a side view of an IC package produced using the processing steps of FIGS. 3 and 5, and then assembled to a finned external heat sink.

FIG. 7 represents an optional step of attaching a finned heat sink 34 to the thermal leads 28 of FIG. 6. For this purpose, the distal ends 38 of the thermal leads 28 are bent outward away from the package housing 26, creating multiple flanges to which the heat sink 34 can be attached with a suitable bonding material 36, such as an adhesive or solder.

While the invention has been described in terms of a particular embodiment, it is apparent that other forms could be adopted by one skilled in the art. For example, the leadframe could be configured differently from that shown in the Figures and yet achieve the objects of this invention, the package could contain various electrical components for a variety of applications, and different materials could be used than those noted. Accordingly, the scope of the invention is to be limited only by the following claims.

What is claimed is:

1. An electronic package comprising:
   a molded housing;
   a circuit device encased within the housing;
   multiple electrical leads extending from the housing, each of the electrical leads having an interior end within the housing, adjacent but separate from the device, and electrically connected to the circuit device, each of the electrical leads having an exterior end outside of the housing extending in a first direction and adapted for electrical connection to a substrate; and
   a thermally-conductive support structure electrically separate from the electrical leads, the support structure comprising a base portion within the housing and multiple thermal leads integral with and extending from the base portion interposed between electrical leads, the circuit device being attached to the base portion, the thermal leads protruding outside the housing and extending in a second direction generally opposite the first direction and having distal ends spaced apart from the housing to dissipate heat conducted away from the circuit device through the base portion.

2. The electronic package according to claim 1, wherein portions of the electrical leads and the thermal leads are interdigitized along the perimeter of the base portion of the support structure.

3. The electronic package according to claim 1, wherein the electrical leads are electrically connected to the circuit device with wire bonds.

4. The electronic package according to claim 1, wherein the housing is an overmolded housing that protectively encases the circuit device, the base portion of the support structure, the interior ends of the electrical leads, and interior portions of the thermal leads.

5. The electronic package according to claim 1, wherein the support structure and the electrical leads are separated portions of a single leadframe.

6. The electronic package according to claim 1, further comprising a heat sink thermally coupled to distal ends of the thermal leads.

7. The electronic package according to claim 1, wherein the base portion of the support structure and the interior ends of the electrical leads lie in the same plane within the housing.

8. The electronic package according to claim 1, wherein the base portion of the support structure and the interior ends of the electrical leads lie in different but parallel planes within the housing.

9. An IC package comprising:
   an overmolded housing;
   an integrated circuit chip encased within the housing;
   multiple electrical leads extending from the housing, each of the electrical leads having an interior end within the housing, the interior ends of the electrical leads being adjacent but separate from an outer perimeter of the integrated circuit chip and spaced apart from each other along the perimeter of the integrated circuit chip, each of the electrical leads having an exterior end outside of the housing and adapted for electrical connection to a substrate;
   means for electrically connecting the integrated circuit chip to the interior ends of the electrical leads; and
   a thermally-conductive support structure electrically separate from the electrical leads, the support structure comprising a base portion within the housing and multiple thermal leads integral with and extending from the base portion, the integrated circuit chip being attached to the base portion, the thermal leads having interior portions contiguous with the base portion and having distal ends protruding outside the housing and configured to dissipate heat conducted away from the integrated circuit chip through the base portion, the interior portions of the thermal leads being interdigitized with the interior ends of the electrical leads along the perimeter of the base portion, the exterior ends of the electrical leads and the distal ends of the thermal leads diverging in opposite directions from each other outside the housing.

10. An electronic packaging method comprising the steps of:
    providing a thermally and electrically conductive leadframe comprising a base portion and at least two sets of leads extending from the base portion;
    separating a first set of the two sets of leads from the base portion and from a second set of the two sets of leads, each lead of the first set of leads having an interior end adjacent but separate from the base portion, each lead of the second set of leads having an interior portion that remains attached to the base portion, wherein leads of the second set are interposed between leads of the first set;
    mounting a circuit device to the base portion;
    electrically connecting the circuit device to the interior ends of the first set of leads; and
    encasing the circuit device, the base portion of the conductive leadframe, the interior ends of the first set of leads, and the interior portions of the second set of leads within a molded housing, exterior ends of the first set of leads projecting outside of the housing as connector terminals for the circuit device, distal ends of the second set of leads projecting outside of the housing as thermal dissipaters for the circuit device
    bending the exterior ends of the first set of leads to extend in a first direction, and the exterior ends of the second set of leads to extend in a second direction generally opposite the first direction spaced apart form the housing.

11. The electronic packaging method according to claim 10, wherein portions of the first and second sets of leads are interdigitized along the perimeter of the base portion as a result of the separating step and remain interdigitized following the encasing step.

12. The electronic packaging method according to claim 10, wherein the electrical connecting step is a wirebonding process that results in the interior ends of the first set of leads being electrically connected to the circuit device with wire bonds.

13. The electronic packaging method according to claim 10, wherein the encasing step is an overmolding process comprising the steps of:
   placing the leadframe with the circuit device mounted thereon in a mold; and then
   introducing an overmolding compound in the mold to protectively encase the circuit device, the base portion of the support structure, the interior ends of the first set of leads, and the interior portions of the second set of leads.

14. The electronic packaging method according to claim 11, further comprising the step of transferring heat from the second set of leads to a heat sink attached to the distal ends of the second set of leads, or to air, a liquid, or a phase change material contacting the second set of leads.

15. The electronic packaging method according to claim 10, wherein following the separating step the base portion of the leadframe and the interior ends of the first set of leads lie in the same plane within the housing.

16. The electronic packaging method according to claim 10, wherein following the separating step the base portion of the leadframe and the interior ends of the first set of leads lie in different but parallel planes within the housing.

17. An IC packaging method comprising the steps of:
   providing a thermally and electrically conductive leadframe comprising a base portion and at least two sets of leads extending from the base portion;
   separating a first set of the two sets of leads from the base portion and from a second set of the two sets of leads, each lead 918) of the first set of leads having an interior end adjacent but separate from an outer perimeter of the base portion and spaced apart from each other along the perimeter of base portion, each lead of the second set of leads having an interior portion that remains attached to the base portion, the interior portions of the second set of leads being interdigitized with the interior ends of the first set of leads along the perimeter of the base portion;
   mounting an integrated circuit chip to the base portion;
   electrically connecting the integrated circuit chip to the interior ends of the first set of leads;
   encasing the integrated circuit chip, the base portion of the conductive leadframe, the interior ends of the first set of leads, and the interior portions of the second set of leads within an overmolded housing, exterior ends of the first set of leads projecting outside of the housing as connector terminals for the integrated circuit chip, distal ends of the second set of leads projecting outside of the housing as thermal dissipaters for the integrated circuit chip; and
   forming the exterior ends of the first set of leads and the distal ends of the second set of leads to diverge in opposite directions from each other outside the housing.

18. The IC packaging method according to claim 17, further comprising the step of transferring heat from the second set of leads to a heat sink attached to the distal ends of the second set of leads, or to air, a liquid, or a phase change material contacting the second set of leads.

* * * * *